United States Patent
Chou et al.

(10) Patent No.: US 11,139,230 B2
(45) Date of Patent: Oct. 5, 2021

(54) FLIP-CHIP PACKAGE SUBSTRATE AND METHOD FOR PREPARING THE SAME

(71) Applicant: PHOENIX PIONEER TECHNOLOGY CO., LTD., Hsinchu County (TW)

(72) Inventors: Pao-Hung Chou, Hsinchu County (TW); Chun-Hsien Yu, Hsinchu County (TW); Shih-Ping Hsu, Hsinchu County (TW)

(73) Assignee: PHOENIX PIONEER TECHNOLOGY CO., LTD., Hsinchu County (TW)

(*) Notice: Subject to any disclaimer, the term of this patent is extended or adjusted under 35 U.S.C. 154(b) by 0 days.

(21) Appl. No.: 16/542,569

(22) Filed: Aug. 16, 2019

(65) Prior Publication Data

US 2020/0066624 A1    Feb. 27, 2020

(30) Foreign Application Priority Data

Aug. 24, 2018  (CN) .......................... 201810973106.8

(51) Int. Cl.
*H01L 23/498* (2006.01)
*H01L 21/48* (2006.01)

(52) U.S. Cl.
CPC ...... *H01L 23/49827* (2013.01); *H01L 21/481* (2013.01); *H01L 21/486* (2013.01); *H01L 21/4857* (2013.01); *H01L 23/49822* (2013.01)

(58) Field of Classification Search
CPC . H01L 21/481; H01L 21/4857; H01L 21/486; H01L 23/49822; H01L 23/49827; H05K 1/0271; H05K 3/4602; H05K 3/46; H05K 3/4608
See application file for complete search history.

(56) References Cited

U.S. PATENT DOCUMENTS

| 9,269,593 B2 * | 2/2016 | Hurwitz | H01L 23/3677 |
| 2015/0181703 A1 * | 6/2015 | Tanaka | H05K 1/0298 361/748 |
| 2016/0381792 A1 * | 12/2016 | Mok | H05K 1/0271 174/251 |

\* cited by examiner

*Primary Examiner* — Hoa C Nguyen
*Assistant Examiner* — Amol H Patel
(74) *Attorney, Agent, or Firm* — Amin, Turocy & Watson, LLP (57) ABSTRACT

A flip-chip package substrate and a method for preparing the same in accordance with the present disclosure includes stacking a reinforcement layer on two opposing sides of a middle layer in order to increase the rigidity of the flip-chip package substrate, and promoting a thin middle layer, wherein the sizes of the end faces of conductive portions can be minimized according to needs. This increases the number of electrical contacts possible in a unit area and enables the creation of finer line pitch and higher layout density of the circuit portions, thereby satisfying the need for packaging of high integration/large scale chips while preventing warpage from occurring in the electronic packages.

15 Claims, 9 Drawing Sheets

FLIP-CHIP PACKAGE SUBSTRATE AND METHOD FOR PREPARING THE SAME

BACKGROUND

1. Technical Field

The present disclosure relates to flip-chip package substrates, and, more particularly, to a flip-chip package substrate used in the semiconductor manufacturing processes and a method for preparing the same.

2. Description of Related Art

With the developments in 5G high-frequency communication, Augmented Reality (AR), Virtual Reality (VR), and the like, high-end semiconductor packaging techniques are in great demand for applications in semiconductor flip-chip packages or multi-chip packages for artificial intelligent (AI) chips, high-end chips or multi-chips. Under the demands of these types of packaging, the sizes of the packages inevitably become larger with a higher number of stacked layers, and the circuit layouts are tending towards high density, fine line pitch, and high number of electrical contacts.

One shortcoming of the current packages for high-end chips and their applications is that the thicknesses of the core layers in the flip-chip packages need to be increased to accommodate the higher numbers of electrical contacts and larger and more complicated layout requirements associated with the packages for high-integration chips (e.g., AI chips) and to also avoid warpage of the boards. However, this also increases the cross-sectional sizes of through holes, which leads to larger pitch between the electrical contacts and thus a smaller number of electrical contacts in a unit area, a lower line density, and larger line pitch. In view of these requirements, the sizes of the flip-chip packages inevitably become larger and thicker. This makes the packaging processes more challenging.

Figure 1A:
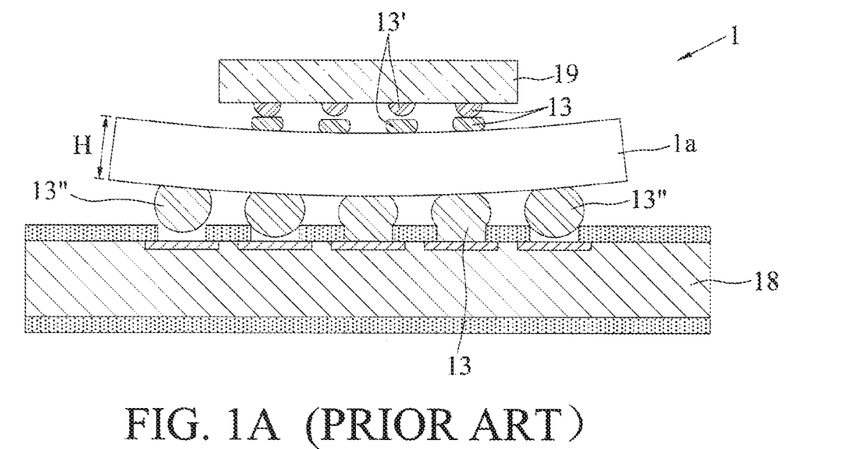
FIG. 1A is a cross-sectional schematic diagram illustrating an electronic device in the prior art.
Figure 1B:
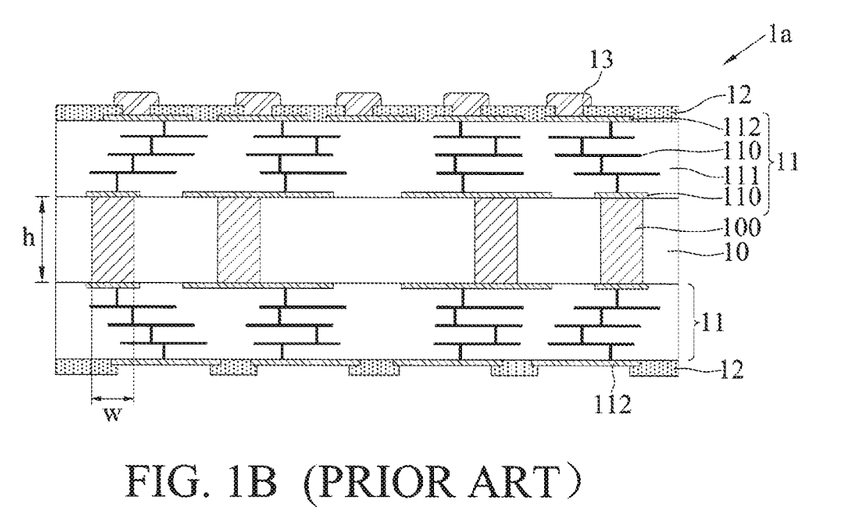
FIG. 1B is a cross-sectional schematic diagram illustrating a substrate package in the prior art.

Therefore, large-scale flip-chip package substrates, such as substrate structures of 45×45 mm$^2$, 70×70 mm$^2$ or 80×80 mm$^2$ are currently being used for carrying high-integration chips, such as AI chips, high-end chips or multi-chips for packaging. As shown in FIG. 1A, an electronic device 1 includes: a circuit board 18, a large-scale flip-chip package substrate 1a provided on the circuit board 18, and a high-integration semiconductor chip 19 bonded to the flip-chip package substrate 1a. As shown in FIG. 1B, the flip-chip package 1a includes a core layer 10, buildup structures 11 on the top and the bottom of the core layer 10, and solder-resist layers 12 on the buildup structures 11. The core layer 10 includes electrically conductive through holes 100 for electrically connecting circuit layers 110 of the buildup structures 11. Each of the buildup structures 11 further includes at least one dielectric layer 111 for encapsulating the circuit layers 110. The outermost circuit layers 110 of the buildup structures 11 are exposed from the respective solder-resist layers 12 to be used as electrical contacts 112 for bonding to the circuit board 18 and the semiconductor chip 19 via soldering materials 13.

Figure 1C:
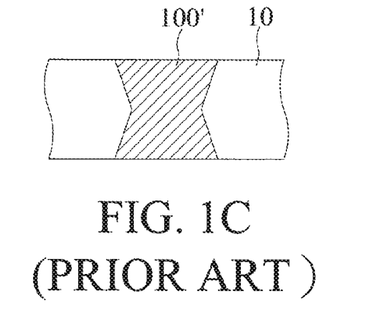
FIGS. 1C and 1D are cross-sectional schematic diagrams illustrating various conductive through holes in the prior art.
Figure 1D:
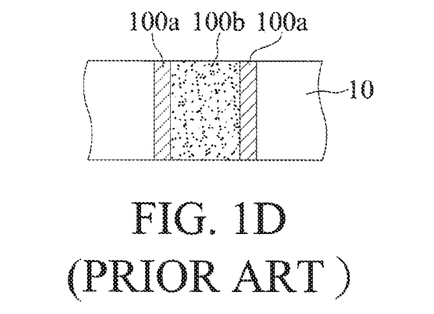

In a traditional manufacturing process of the core layer 10, a substrate consists of fiberglass and epoxy resin is used, such as Bismaleimide Triazine (BT) or FR5, etc. Then, a drilling process, such as mechanical drilling or laser drilling can be used to form the electrically conductive through holes 100, or a double cone blind via forming process can be used to form the electrically conductive through holes 100' shown in FIG. 1C. An electrically conductive layer is then plated in the holes, or a filler is then filled into the holes, forming the electrically conductive through holes 100, 100' shown in FIGS. 1B and 1C, or conductive materials 100a and an insulating material 100b shown in FIG. 1D.

However, the conventional flip-chip package substrate 1a has apparent shortcomings when applied to high-integration/large scale chip packaging. For example, the core layer 10 is a substrate made of fiberglass combined with epoxy resin, which have different coefficients of thermal expansion (CTEs) and may causing warpage of the core layer 10 during packaging. This may result in poor connection with the semiconductor chip 19 (e.g., shown by a soldering material 13' not properly bonded or fractured in FIG. 1A) or poor connection with the circuit board 18 (e.g., shown by a soldering material 13" not properly bonded or fractured in FIG. 1A) during soldering. It may even lead to the fracturing of the semiconductor chip 19 or electrical failure of the semiconductor chip 19 due to stress.

As a result, the thickness h of the core layer 10 is increased, for example, from 0.8 mm with an aperture w of 0.1 mm to 1.2 mm with an aperture of more than 0.2 mm. This increases the rigidity of the flip-chip package substrate 1a and alleviates warpage, but brings with it a whole array of new problems as described below.

1. Increasing the thickness of the core layer 10 fails to meet the demands for compactness and miniaturization of packaging.

2. The number of electrical contacts in a unit area cannot be increased. More specifically, the result of increasing the thickness of the core layer 10 is that, under traditional techniques, the size of the end faces of the electrically conductive through holes 100, 100' has to be increased (i.e., larger aperture w), forcing the pitch between the electrically conductive through holes 100, 100' to increase, decreasing the maximum number of electrical contacts possible in a unit area.

3. Line pitch is increased, and line density is decreased. More specifically, the result of increasing the thickness of the core layer 10 is that, under traditional techniques, the size of the end faces of the electrically conductive through holes 100, 100' has to be increased to occupy more layout area. This unfavorably decreases the area available for the overlying circuit layers 110, thereby making it difficult to manufacture electrically conductive through holes 100 with a fine line pitch or high density.

4. It becomes more challenging to electroplate and fill the electrically conductive through holes 100, 100'. More specifically, the result of increasing the thickness of the core layer 10 is that the electrically conductive through holes 100, 100' becomes deeper, which makes it difficult to perform electroplating and filling of the filler 100b in the deep electrically conductive through holes 100, 100', in some cases, voids may be formed in the blind vias.

5. The cost and level of difficulty in manufacturing the electrically conductive through holes 100, 100' increase with the increase in the thickness of the core layer 10. More specifically, the thickness of a core layer 10 is traditionally increased by using a dielectric material containing a fiberglass cloth to prevent warpage, but it becomes more difficult to produce deep electrically conductive through holes 100, 100' of fine apertures in these kind of materials with laser or mechanical drilling. As a result, the manufacturing cost cannot be lowered.

6. Resistance is increased, and electrical properties deteriorates. More specifically, the overall thickness of the flip-chip package substrate 1a is increased with the increase in the thickness h of the core layer 10, which would lead to longer conduction paths and higher resistance, resulting in poor electrical properties.

7. Heat dissipation is lower. More specifically, with the increased thickness of the core layer 10 and the increased thickness of the flip-chip package substrate 1a, heat dissipation of the flip-chip package substrate 1a becomes more difficult. Poor heat dissipation adversely affects the overall performance and lifespan of the device.

Therefore, there is a need for a solution that addresses the aforementioned shortcomings in the prior art.

SUMMARY

In view of the aforementioned shortcomings of the prior art, a flip-chip package substrate is provided, which may include: a middle layer including a first side and a second side opposing the first side; a plurality of first conductive pillars provided in and penetrating the middle layer, each of the first conductive pillars having two opposite ends exposed from the first side and the second side of the middle layer, respectively; a plurality of reinforcement layers bonded to the first side and the second side of the middle layer, a plurality of openings being formed in the reinforcement layers at places corresponding to where the first conductive pillars are provided in the middle layer; a plurality of insulating portions provided on the first side and the second side of the core and each including a first insulating layer and a second insulating layer, the reinforcement layers being bonded to the first side and the second side via a respective one of the first insulating layers, and the reinforcement layers and the openings being covered by a respective one of the second insulating layers; a plurality of second conductive pillars provided in the openings, each of the second conductive pillars having one end connected to a first conductive pillar and the other end exposed from a surface of a respective one of the insulating portions, wherein the first conductive pillars and the second conductive pillars form conductive portions; and a circuit portion formed on the insulating portions and electrically connected with the second conductive pillars of the conductive portions.

In an embodiment, the middle layer is an insulating material, such as an organic resin material, any fiberglass cloth, an organic resin containing a filler (e.g., $SiO_2$ or fiberglass powder), or an insulating non-organic material (e.g., an insulating oxide, nitride or aluminide, ceramic, etc.), or the middle layer is an electrically conductive material, such as aluminum, aluminum alloy, stainless steel, copper, copper alloy, nickel iron alloy or other conductive materials.

In an embodiment, the reinforcement layers are electrically conductive materials, such as aluminum, aluminum alloy, stainless steel, copper, copper alloy, nickel iron alloy or other conductive materials, or electrically insulating materials, such as ceramic material with high rigidity (e.g., $Al_2O_3$ or AlN), plastic steel, carbon fiber, etc.

A method for preparing a flip-chip package substrate is further provided by the present disclosure, which may include the following steps of: providing an insulating middle layer (such as an organic resin material, any fiberglass cloth, an organic resin containing a filler (e.g., $SiO_2$ or fiberglass powder), or an insulating non-organic material (e.g., an insulating oxide, nitride or aluminide, ceramic, etc.)) including a first side and a second side opposing the first side, a plurality of first conductive pillars provided in and penetrating the insulating middle layer, wherein each of the first conductive pillars having two opposite ends exposed from the first side and the second side of the middle layer, respectively; bonding a reinforcement layer to each of the first side and the second side of the middle layer via a respective first insulating layer; forming a plurality of openings in the reinforcement layers at places corresponding to where the first conductive pillars are provided in the insulating middle layer; forming respective second insulating layers on the reinforcement layers and in the openings, wherein the first insulating layers and the second insulating layers form insulating portions that cover the reinforcement layers; forming second conductive pillars in the insulating portion at places corresponding to where the openings are formed in the reinforcement layers, wherein each of the second conductive pillars having one end connected to one of the first conductive pillars and the other end exposed from a surface of a respective one of the insulating portions, such that the first conductive pillars and the second conductive pillars form conductive portions; and forming on the insulating portions a circuit portion electrically connected with the second conductive pillars of the conductive portion.

In an embodiment, the first conductive pillars and the second conductive pillars may be formed by electroplating, deposition or filling of a conductive material.

Another method for preparing a flip-chip package substrate is further provided by the present disclosure, which may include the following steps of: providing a conductive middle layer (such as aluminum, aluminum alloy, stainless steel, copper, copper alloy, nickel iron alloy or other conductive materials) including a first side and a second side opposing the first side, with the second side of the middle layer bonded to a reinforcement layer via a first insulating layer; forming a plurality of annular openings in the middle layer to delineate first conductive pillars; bonding another reinforcement layer to the first side of the middle layer via another first insulating layer, and the another first insulating layer being filled into the openings for insulating the middle layer from the first conductive pillars; forming a plurality of openings in the reinforcement layers at places corresponding to where the first conductive pillars are provided in the middle layer; forming respective second insulating layers on the reinforcement layers and in the openings, wherein the first insulating layers and the second insulating layers form insulating portions that covers the reinforcement layers; forming second conductive pillars in the insulating portions at places corresponding to where the openings are formed in the reinforcement layers, wherein each of the second conductive pillars has one end connected to one of the first conductive pillars and the other end exposed from a surface of a respective one of the insulating portions, such that the first conductive pillars and the second conductive pillars form conductive portions; and forming on the insulating portion a circuit portion electrically connected with the second conductive pillars of the conductive portion.

In an embodiment, the second conductive pillars are formed by electroplating, deposition or filling of a conductive material.

In an embodiment, the end faces of first conductive pillars and the second conductive pillars are of different sizes or the same size.

In an embodiment, the circuit portions are of a single-layer circuit type or a build-up circuit type.

As can be understood from the above, the flip-chip package substrate and the method for preparing the same in accordance with the present disclosure are capable of increasing the rigidity of the flip-chip package substrate by providing reinforcement layers on the first and second sides of the middle layer. Thus, compared to the prior art, the present disclosure can prevent warpage from occurring during the semiconductor packaging process. Furthermore, the sizes of the end faces of the conductive portions can be minimized according to needs. This increases the number of electrical contacts possible in a unit area and enables the creation of finer line pitch and higher layout density of the circuit portions, thereby satisfying the need for packaging of high integration chips.

DETAILED DESCRIPTION OF THE EMBODIMENTS

Aspects of the present disclosure are described by the following specific embodiments. The advantages and effects of the present disclosure can be readily understood by one of ordinary skill in the art upon reading the disclosure of this specification. The present disclosure may also be practiced or applied using other different embodiments. Based on different contexts and applications, the various details in this specification can be modified and changed without departing from the spirit of the present disclosure.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "above", "first", "second", "one", "a", "an", and the like, are for illustrative purposes only, and are not meant to limit the range implementable by the present disclosure. Any changes or adjustments made to their relative relationships, without modifying the substantial technical contents, are also to be construed as within the range implementable by the present disclosure.

FIGS. 2A to 2E are cross-sectional schematic diagrams illustrating a method for preparing a flip-chip package substrate 2 in accordance with a first embodiment of the present disclosure.

Figure 2A:
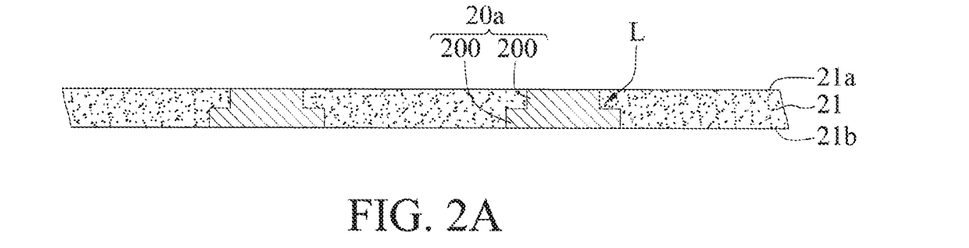
FIGS. 2A to 2E are cross-sectional schematic diagrams illustrating a method for preparing a flip-chip package substrate in accordance with a first embodiment of the present disclosure, wherein FIGS. 2A' and 2A" are other embodiments of FIG. 2A, and FIG. 2D' is a perspective view of a portion of FIG. 2D.

As shown in FIG. 2A, a middle layer 21 including a first side 21a and an opposing second side 21b is provided. A plurality of first conductive pillars 20a are embedded in the middle layer 21. The two opposing end faces of each of the first conductive pillars 20a are connected to and exposed from the first side 21a and the second side 21b, respectively. In an embodiment, the first conductive pillars 20a are formed by electroplating, deposition, or filling of conductive materials (e.g., a solder paste, a conductive glue, etc.).

In an embodiment, the middle layer 21 is made of an insulating material, such as a dielectric material. The dielectric material can be an organic resin material without any fiberglass cloth or an organic resin material containing a filler (e.g., $SiO_2$ or fiberglass powder). In an embodiment, the organic dielectric material includes a molding compound, an epoxy molding compound (EMC) or a primer. The dielectric material can also be an insulating non-organic material (e.g., an insulating oxide, nitride or aluminide, ceramic, etc.).

No circuits are extended from the first conductive pillars 20a. The first conductive pillars 20a are composed of a plurality of pillars 200 stacked one on top of another. The sizes of the end faces of the pillars 200 are different (as shown in FIG. 2A) or the same (as shown in FIG. 2A'), such that the intersection L between the stacked pillars 200 is a stepped shape (as shown in FIG. 2A) or flush (as shown in FIG. 2A'). It can be appreciated that the first conductive pillar 20a may also be integrally formed, and the periphery of the first conductive pillar 20a may be a continuous surface 20c (e.g., an arc surface, a flat surface as shown by the first conductive pillar 20a' in FIG. 2A', or a double conical face as shown by the first conductive pillar 20a" in FIG. 2A"). Therefore, there is no limitation on the profile of the first conductive pillar 20a.

Figure 4A:
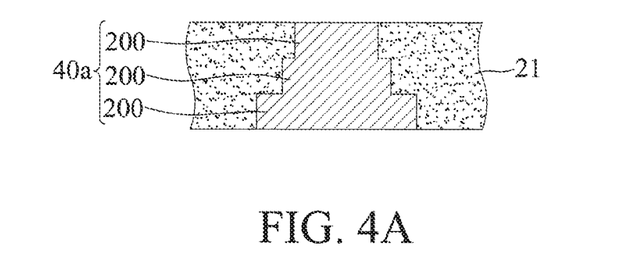
FIGS. 4A to 4C are cross-sectional schematic diagrams illustrating various embodiments of a middle layer of the flip-chip package substrate in accordance with the present disclosure.
Figure 4B:
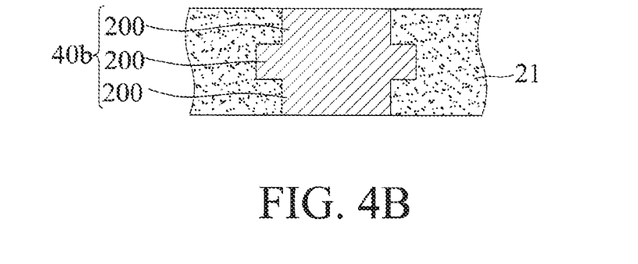
Figure 4C:
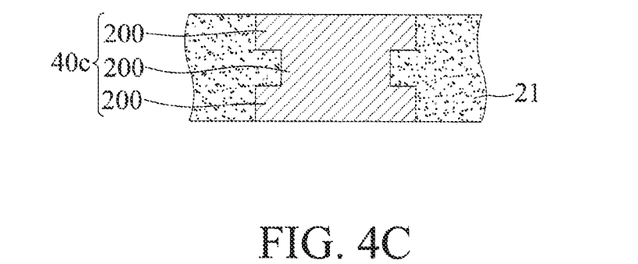

The number of stacked pillars 200 or the profile of the first conductive pillar 20a can be designed according to the needs. As shown in FIGS. 4A to 4C, the first conductive pillars 40a, 40b, 40c each include three pillars 200 stacked one on one another.

Figures 2B, 2C:
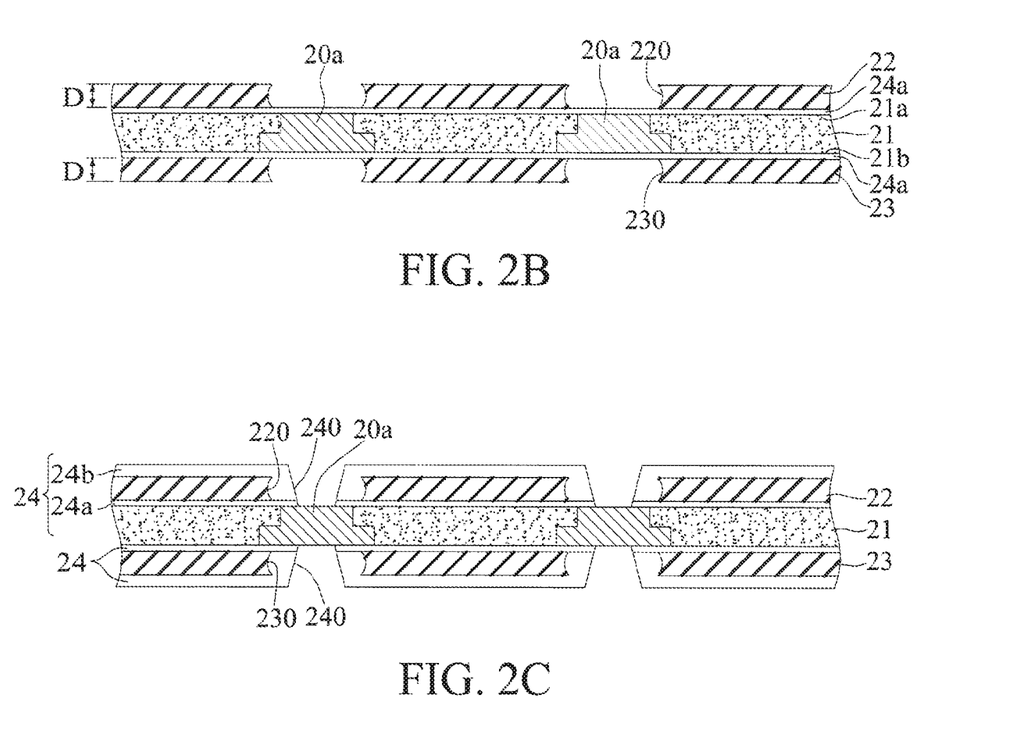

As shown in FIG. 2B, reinforcement layers 22, 23 are disposed on first insulating layers 24a on the first side 21a and the second side 21b of the middle layer 21, respectively. Through a patterning process, a plurality of openings 220, 230 are further formed in the respective reinforcement layers 22, 23 corresponding to where the first conductive pillars 20a are.

In an embodiment, the reinforcement layers 22, 23 can be made of a conductive material, such as aluminum, aluminum alloy, stainless steel, copper, copper alloy, nickel iron alloy or other conductive materials. In another embodiment, the reinforcement layers 22, 23 can be made of an insulating material, such as ceramic material with high rigidity (e.g., $Al_2O_3$ or AlN), plastic steel, carbon fiber, etc. Therefore, the material of the reinforcement layers 22, 23 can be selected according to needs, and is not limited to those described above.

In an embodiment, the first insulating layers 24a can be an organic dielectric material, which can be an organic adhesive. In another embodiment, the organic dielectric material includes a molding compound, an epoxy molding compound (EMC), a primer, or a high-ratio filler (with $SiO_2$ of 75% or more).

As shown in FIG. 2C, second insulating layers 24b are formed on the reinforcement layers 22, 23 and in the openings 220, 230, such that the first and second insulating layers 24a and 24b (together as insulating portions 24) encapsulate the reinforcement layers 22, 23. Through a patterning process, through holes 240 are formed by laser in the insulating portions 24 at places corresponding to where the openings 220, 230 are, such that the two end faces of each of the first conductive pillars 20a are exposed from the respective through holes 240.

In an embodiment, the second insulating layers 24b can be formed on the reinforcement layers 22, 23 and in the openings 220, 230 through a coating or lamination process. In another embodiment, the second insulating layers 24b are an organic dielectric material, which can be an organic resin material without any fiberglass cloth or an organic resin material containing a filler (e.g., $SiO_2$ or fiberglass powder). In yet another embodiment, the organic dielectric material may include an Ajinomoto Build-up Film (ABF), a FR5, an RCC, a molding compound, an epoxy molding compound (EMC) or a high-ratio primer (with $SiO_2$ of 75% or more). It should be appreciated that the first insulating layers 24a and the second insulating layers 24b may be the same or different.

The molding compound or the primer in the insulating portions 24 has anti-warpage effect.

Figure 2D:
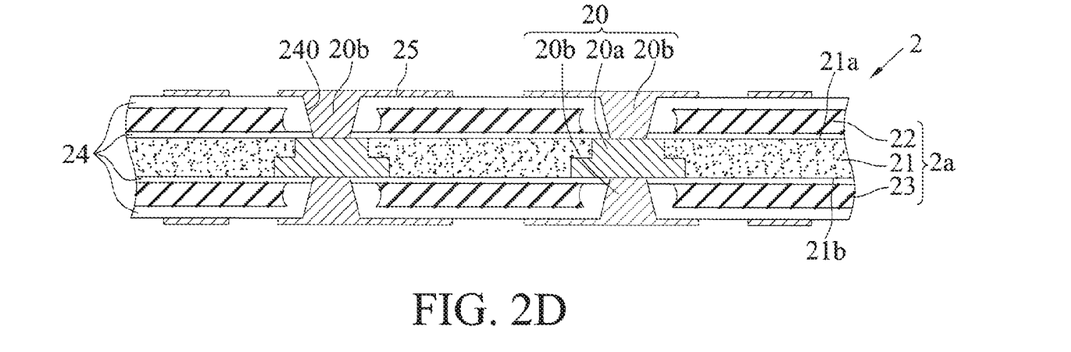

As shown in FIG. 2D, a plurality of second conductive pillars 20b are formed in the through holes 240 of the insulating portions 24 by electroplating, deposition or filling of a conductive material (e.g., a solder paste or conductive glue), such that these second conductive pillars 20b stacked on top of and electrically connected to the first conductive pillars 20a. A single-layer circuit portion 25 is formed on the two outermost surfaces of the insulating portions 24 simultaneously or sequentially, such that the circuit portion 25 is electrically connected with the second conductive pillars 20b.

In an embodiment, one first conductive pillar 20a and two second conductive pillars 20b correspondingly connected form a single stacked pillar-shaped conductive portion 20. The periphery (or profile) of the conductive portion 20 is rugged S (as shown in FIG. 2D'), for example, a size the end face of the first conductive pillar 20a (as shown in FIG. 2D') is different from those of the second conductive pillars 20b. It can be appreciated that the periphery (or profile) of the conductive portion 20 may also be in the form of a flat surface or a flat beveled surface. Therefore, there is no limitation on the profile shape of the conductive portion 20.

The middle layer 21 and the two reinforcement layers 22, 23 form a core structure 2a.

Figure 2E:
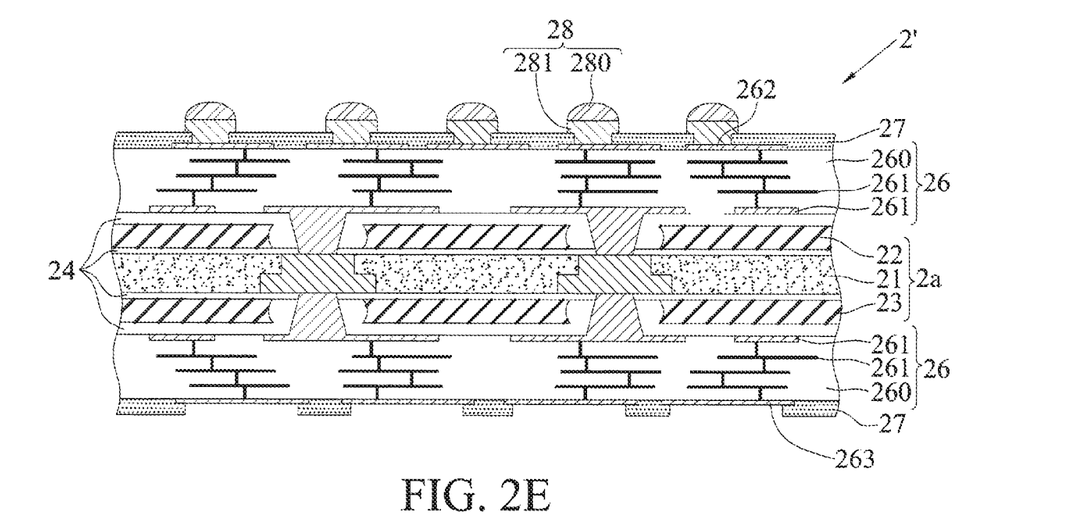

In an embodiment, the circuit portion may also be formed in build-up structures, and the number of build-up layers can be selected according to needs. As shown in FIG. 2E, a build-up circuit portion 26 is formed on the two outermost surfaces of the insulating portions 24 simultaneously or sequentially, which includes at least a dielectric layer 260 and a plurality of circuit layers 261 bonded to the dielectric layer 260. Insulating protective layers 27 can also be formed on the circuit portions 26, such that the outermost circuit layers 261 are exposed from the respective insulating protective layers 27 to be used as electrical contact pads 262, 263 for bonding with conductive components 28 or solder balls (not shown). In an embodiment, the dielectric layer 260 can be an epoxy resin, such as an ABF, a prepreg, or an EMC, and the insulating protective layer 27 can be a solder resist, such as a photosensitive ink, an ABF, or a non-photosensitive dielectric material (e.g., an EMC). The conductive components 28 can include soldering materials 280 and/or metal bumps 281 (e.g., copper bumps).

Figure 2F:
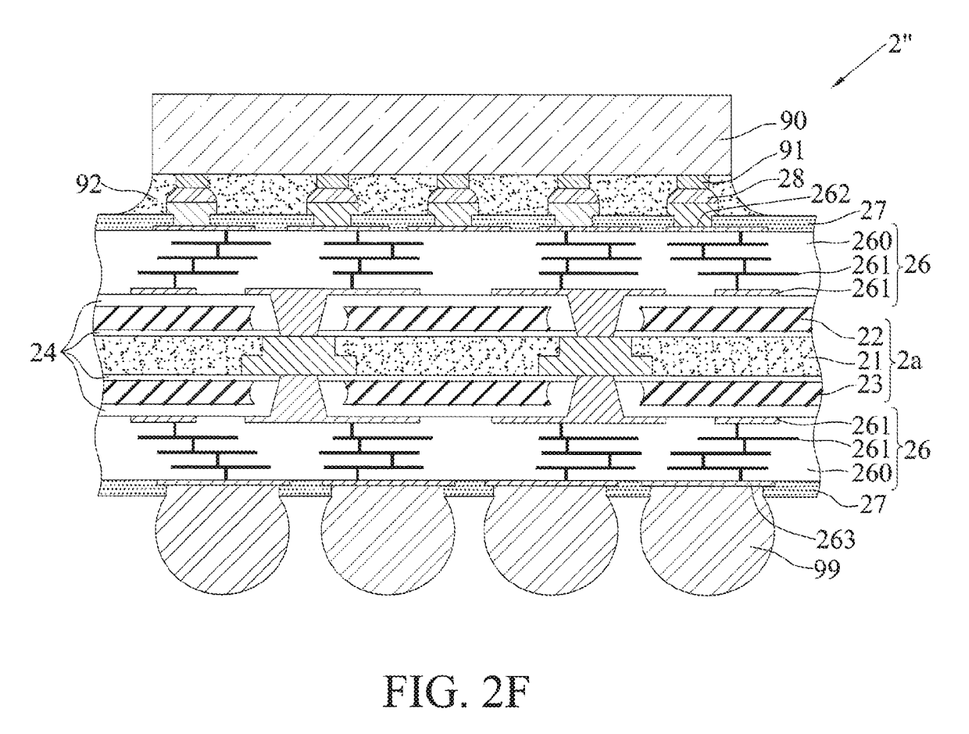
FIG. 2F is a cross-sectional schematic diagram illustrating an application of FIG. 2E.

In the subsequent process, as shown in the structure of an electronic package 2" in FIG. 2F, at least one electronic component 90 is disposed on the circuit portion 25 on one of the sides of the flip-chip package substrate 2 or the electrical contact pads 262 on one of the sides of the flip-chip package substrate 2' via the conductive components 28 (as shown in FIG. 2F). In another embodiment, conductive components 99 (e.g., solder balls) are provided on the circuit portion 25 on the other side of the flip-chip package substrate 2 or the electrical contact pads 262 on the other side of the flip-chip package substrate 2' for connecting to an external circuit board (not shown).

The electronic component 90 can be an active element, a passive element or a combination of both, wherein the active element can be, for example, a semiconductor chip, and the passive element can be, for example, a resistor, a capacitor or an inductor. In an embodiment, the electronic component is electrically connected to the circuit portion by the flip-chip method. In another embodiment, the electronic component 90 are disposed on the flip-chip package substrate 2, 2' via a plurality of conductive bumps 91 and/or the conductive components 28, and the conductive bumps 91 and/or the conductive components 28 are further covered by an underfill 92, and the electronic component 90 is optionally encapsulated by an encapsulating layer (not shown).

The encapsulating layer can be a thin film used in the lamination process, an encapsulant used in the molding process or an adhesive used in the printing process. The encapsulating layer can be made of a polyimide (PI), a dry film, an epoxy, etc., and the present disclosure is not limited to these.

FIGS. 3A to 3E are cross-sectional schematic diagrams illustrating a method for preparing a flip-chip package substrate 3 in accordance with a second embodiment of the present disclosure. The second embodiment is different from the first embodiment primarily in the material of the middle layer, and the rest of the structures are similar or the same, and are omitted for conciseness.

Figure 3A:
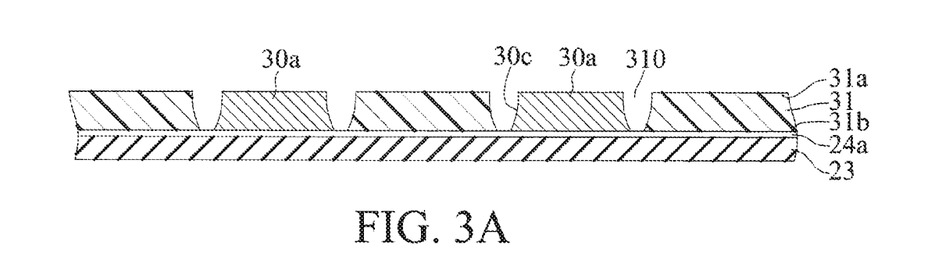
FIGS. 3A to 3E are cross-sectional schematic diagrams illustrating a method for preparing a flip-chip package substrate in accordance with a second embodiment of the present disclosure, wherein FIG. 3A' is a top view of a portion of FIG. 3A, and FIG. 3D' is a perspective view of a portion of FIG. 3D.

As shown in FIG. 3A, a middle layer 31 including a first side 31a and an opposing second side 31b is provided. The middle layer 31 is made of a conductive material, such as aluminum, aluminum alloy, stainless steel, copper, copper alloy, nickel iron alloy or others. The middle layer 31 is bonded onto a reinforcement layer 23 on its second side 31b via a first insulating layer 24a. Furthermore, a plurality of annular openings 310 are formed in the middle layer 31, such that a plurality of first conductive pillars 30a are delineated by these openings 310, wherein the two opposing end faces of the first conductive pillars 30a correspond to the first side 31a and the second side 31b of the middle layer 31, respectively.

In an embodiment, no circuits are extended from the first conductive pillars 30a, and the first conductive pillars 30a are integrally formed. As shown in FIG. 3A', annular openings 310 wider at the top and narrower at the bottom are formed in the middle layer 31 by etching to delineate the first conductive pillars 30a.

Figure 5A:
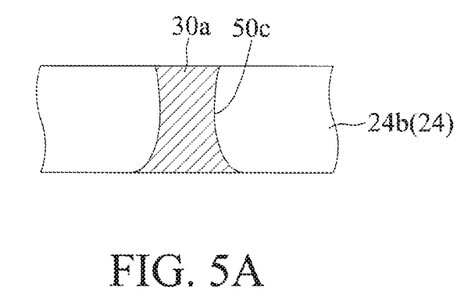
FIGS. 5A and 5B are cross-sectional schematic diagrams illustrating various other embodiments of the middle layer of the flip-chip package substrate in accordance with the present disclosure.
Figure 5B:
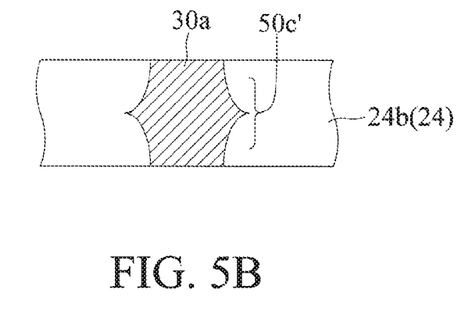

In an embodiment, the periphery shape of the first conductive pillars 30a can be designed according to needs, example, as an arc conical periphery 50c (narrower at the top and wider at the bottom) shown in FIG. 5A or an arc double conical periphery 50c' (formed by etching sequentially) shown in FIG. 5B.

Figure 3B:
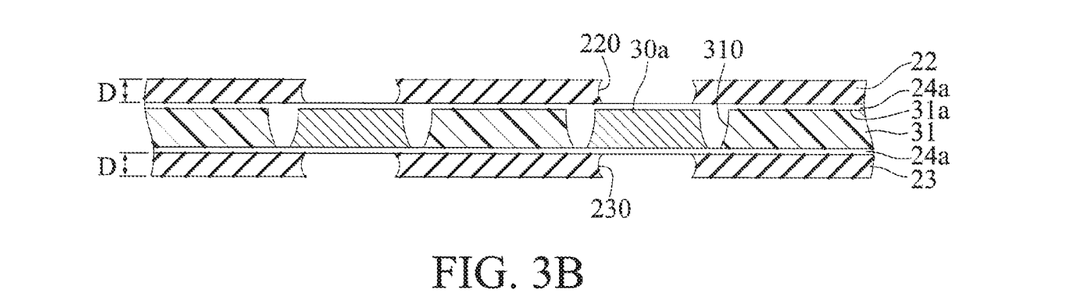

As shown in FIG. 3B, the middle layer 31 is bonded to another reinforcement layer 22 on its first side 31a via another first insulating layer 24a, with the openings 310 further filled with the another first insulating layer 24a to insulate the middle layer 31 and the first conductive pillars 30a. Next, through the patterning process, a plurality of openings 220, 230 are formed in the reinforcement layers 22, 23 at places corresponding to where the first conductive pillars 30a are.

In an embodiment, the reinforcement layers 22, 23 can be made of a conductive material, such as aluminum, aluminum alloy, stainless steel, copper, copper alloy, nickel iron alloy or other conductive materials. In another embodiment, the reinforcement layers 22, 23 can be made of an insulating material, such as ceramic material with high rigidity (e.g., $Al_2O_3$ or AlN), plastic steel, carbon fiber, etc. Therefore, the material of the reinforcement layers 22, 23 can be selected according to needs, and is not limited to those described above.

Figure 3C:
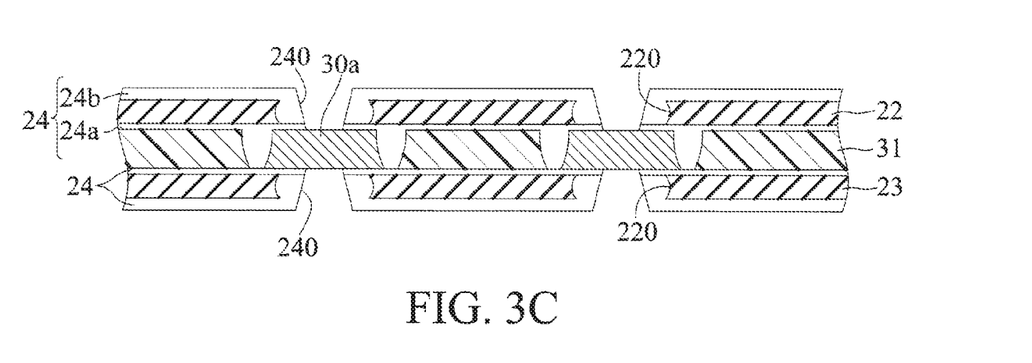

As shown in FIG. 3C, second insulating layers 24b are formed on the reinforcement layers 22, 23 and in the openings 220, 230, such that the first and second insulating layers 24a and 24b (together as insulating portions 24) encapsulate the reinforcement layers 22, 23. Through a patterning process, through holes 240 are formed by laser in the insulating portions 24 at places corresponding to where the openings 220, 230 are, such that the two end faces of each of the first conductive pillars 20a are exposed from the respective through holes 240.

Figure 3D:
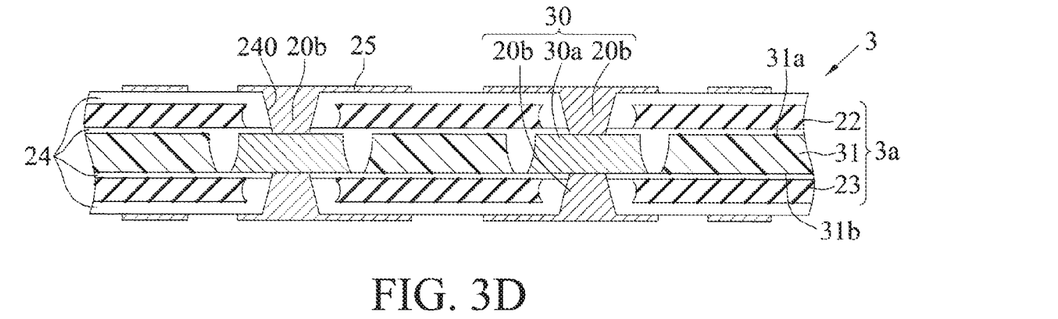
Figure 3E:
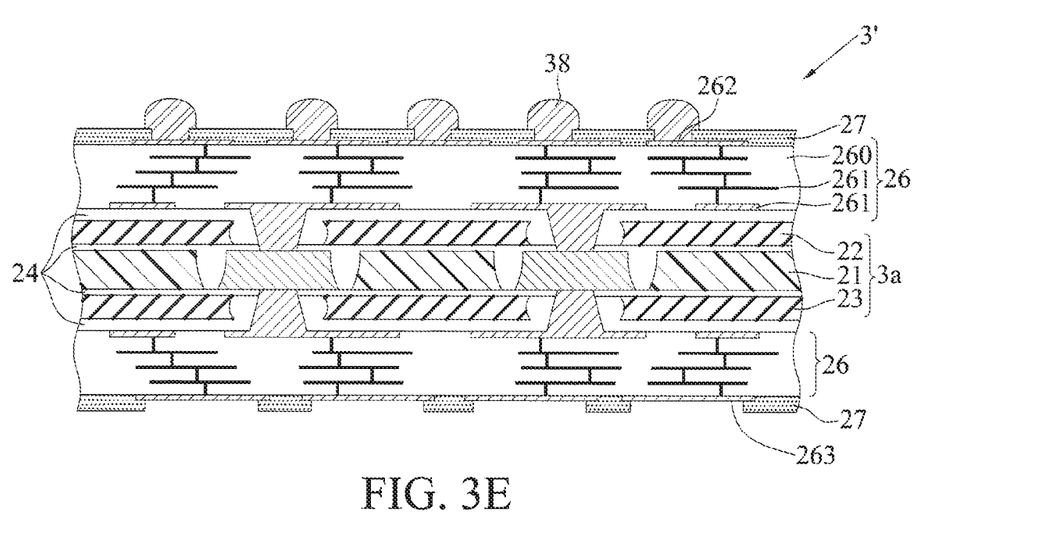

As shown in FIG. 3D, a plurality of second conductive pillars 20b are formed in the through holes 240 of the insulating portions 24 by electroplating, deposition or filling of a conductive material (e.g., a solder paste or conductive glue), such that these second conductive pillars 20b stacked on top of and electrically connected to the first conductive pillars 20a. A single-layer circuit portion 25 is formed on the two outermost surfaces of the insulating portions 24 simultaneously or sequentially, such that the circuit portion 25 is electrically connected with the second conductive pillars 20b.

In an embodiment, one ends of the second conductive pillars 20b are connected to the first conductive pillars 30a, while the other ends thereof are connected to the surfaces of the insulating portions 24, such that the first conductive pillars 30a and the second conductive pillars 20b form stacked pillar-shaped conductive portions 30. The periphery (or profile) of the conductive portion 30 is rugged S (as shown in FIG. 3D'), for example, a size of the end face t of the first conductive pillar 30a is different from those of the second conductive pillars 30b. It can be appreciated that the periphery (or profile) of the conductive portion 30 may also be in the form of a flat surface or a flat beveled surface. Therefore, there is no limitation on the profile shape of the conductive portion 20.

The middle layer 31 and the two reinforcement layers 22, 23 form a core structure 3a.

In an embodiment, the circuit portion may also be formed in build-up structures, and the number of build-up layers can be selected according to needs. As shown in the flip-chip package substrate 3' of FIG. 3E, a build-up circuit portion 26 is formed on the two outermost surfaces of the insulating portions 24 simultaneously or sequentially, which includes at least a dielectric layer 260 and a plurality of circuit layers 261 bonded to the dielectric layer 260. Insulating protective layers 27 can also be formed on the circuit portions 26, with the outermost circuit layers 261 of the circuit layers 26 exposed from the respective insulating protective layers 27 to be used as electrical contact pads 262, 263 for bonding with conductive components 28 or solder balls (not shown). In an embodiment, the dielectric layer 260 can be an epoxy resin, such as an ABF, a prepreg, or an EMC, and the insulating protective layer 27 can be a solder resist, such as a photosensitive ink, an ABF, or a non-photosensitive dielectric material (e.g., an EMC). The conductive components 38 can include soldering materials.

Figure 3F:
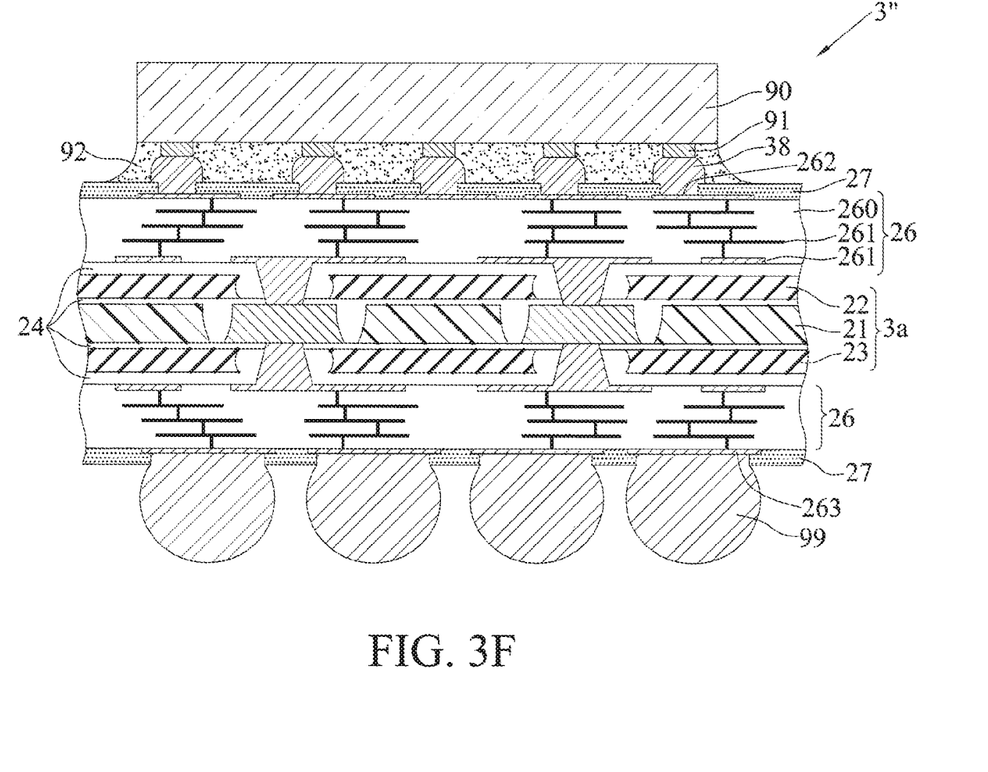
FIG. 3F is a cross-sectional schematic diagram illustrating an application of FIG. 3E.

In the subsequent process, as shown in the structure of an electronic package 3" in FIG. 3F, at least one electronic component 90 is disposed on the circuit portion 25 on one of the sides of the flip-chip package substrate 3 or the electrical contact pads 262 on one of the sides of the flip-chip package substrate 3' via the conductive components 38 (as shown in FIG. 3F). In an embodiment, conductive components 99 (e.g., solder balls) are provided on the circuit portion 25 on the other side of the flip-chip package substrate 3 or the electrical contact pads 262 on the other side of the flip-chip package substrate 3' for connecting to an external circuit board (not shown).

The electronic component 90 can be an active element, a passive element or a combination of both, wherein the active element can be, for example, a semiconductor chip, and the passive element can be, for example, a resistor, a capacitor or an inductor. In an embodiment, the electronic component is electrically connected to the circuit portion by the flip-chip method. In another embodiment, the electronic component 90 are disposed on the flip-chip package substrate 3, 3' via a plurality of conductive bumps 91 and/or the conductive components 38, and the conductive bumps 91 and/or the conductive components 38 are further covered by an underfill 92, and the electronic component 90 is optionally encapsulated by an encapsulating layer (not shown).

The encapsulating layer can be a thin film used in the lamination process, an encapsulant used in the molding process or an adhesive used in the printing process. The encapsulating layer can be made of a polyimide (PI), a dry film, an epoxy, etc., and the present disclosure is not limited to these.

With the preparation method according to the present disclosure, the composite core structure 2a, 3a is formed by providing the reinforcement layers 22, 23 on the first side 21a, 31a and the second side 21b, 31b of the middle layer 21, 31, respectively, to increase the rigidity of the flip-chip package substrate 2, 2', 3, 3'. Compared to the prior art, the flip-chip package substrate 2, 2', 3, 3', when applied to a high-integration/large scale semiconductor packaging process, prevents warpage from occurring even in high temperature process due to its high rigidity, thereby eliminating poor connections between itself and a semiconductor chip or a circuit board.

Therefore, with the rigidity of the flip-chip package substrate 2, 2', 3, 3' increased by the design of the core structure 2a, 3a, warpage can be prevented in the semiconductor packaging process. Thus, compared to the prior art, the preparation method according to the present disclosure is advantageous in achieving the goal of miniaturization of the flip-chip package substrate 2, 2', 3, 3'.

Furthermore, if the rigidity of the flip-chip package substrate 2, 2', 3, 3' is to be increased, then the thickness D of the reinforcement layers 22, 23 needs to be adjusted according to the level of rigidity required (as shown in FIG. 2B or 3B) without the need to significantly increase the thickness of the middle layer 21, 31. As a result, the end faces of the conductive portions 20, 30 can be kept minimum, and the layout area for the overlying circuit portions 25, 26 will not be compromised, thereby increasing the maximum number of electrical contact pads 262, 263 possible.

The present disclosure further provides a flip-chip package substrate 2, 2', 3, 3', which includes: a middle layer 21, 31; two reinforcement layers 22, 23; insulating portions 24; a plurality of second conductive pillars 20b; and at least one circuit portion 25, 26.

The middle layer 21, 31 includes a first side 21a, 31a and an opposing second side 21b, 31b, and a plurality of first conductive pillars 20a, 30a are provided in the middle layer 21, 31. The two opposite ends of the first conductive pillars 20a, 30a are connected to the first side 21a, 31a and the second side 21b, 31b of the middle layer 21, 31, respectively. The middle layer 21, 31 is insulated from the first conductive pillars 20a, 30a.

The reinforcement layers 22, 23 are stacked on the first side 21a, 31a and the second side 21b, 31b of the middle layer 21, 31 via first insulating layers 24a, respectively. A plurality of openings 220, 230 are formed in the reinforcement layers 22, 23 at places corresponding to where the first conductive pillars 20a, 30a are provided. In an embodiment, the reinforcement layers 22, 23 and the openings 220, 230 are covered by second insulating layers 24b, wherein the first insulating layers 24a and the second insulating layers 24b form insulating portions 24.

The second conductive pillars 20b are formed in the openings 220, 230. One ends of the second conductive pillars 20b are connected to the first conductive pillars 20a, 30a, while the other ends thereof are connected to the surfaces of the insulating portions 24, wherein the first conductive pillars 20a, 30a and the second conductive pillars 20b form conductive portions 20, 30.

Circuit portions 25, 26 are formed as a single-layer or build-up circuit structure on the two outermost surfaces of the insulating portions 24 simultaneously or sequentially, and are electrically connected with the second conductive pillars 20b of the conductive portions 20, 30.

In an embodiment, the middle layer 21 is made of an insulating material, such as an organic resin material any fiberglass cloth, an organic resin containing a filler (e.g., $SiO_2$ or fiberglass powder), or an insulating non-organic material (e.g., an insulating oxide, nitride or aluminide, ceramic, etc.), wherein each of the first conductive pillars 20a in the insulating middle layer 21 is formed of a single pillar or a plurality of pillars stacked together (as shown in FIGS. 4A, 4B, 4C), and the sizes of the end faces of the stacked pillars may be the same or different.

In an embodiment, the middle layer 31 is an electrically conductive material, such as aluminum, aluminum alloy, stainless steel, copper, copper alloy, nickel iron alloy or other conductive materials. Discrete annular openings 310 are formed between the middle layer 31 and the first conductive pillars 30a. In an embodiment, the openings 310 are filled with the first insulating layer 24a.

In an embodiment, the reinforcement layers 22, 23 are electrically conductive materials, such as aluminum, aluminum alloy, stainless steel, copper, copper alloy, nickel iron alloy or other conductive materials.

In an embodiment, the reinforcement layers 22, 23 are insulating materials, such as ceramic material with high rigidity (e.g., $Al_2O_3$ or AlN), plastic steel, carbon fiber, etc.

In an embodiment, one first conductive pillar 20a and a plurality of second conductive pillars 20b form a conductive portion 20, and the sizes of the end faces of the first conductive pillars 20a, 30a and the end faces of the second conductive pillars 20b are different or the same. In an embodiment, the periphery (or profile) of the conductive portion 20, 30 is rugged S (as shown in FIGS. 2D' and 3D'). It can be appreciated that the surface of the periphery (or profile) of the conductive portion 20, 30 may also be flat. Therefore, there is no limitation on the profile shape of the conductive portion 20.

In conclusion, the flip-chip package substrate and the method for preparing the same according to the present disclosure have the rigidity improved by providing a composite reinforced core structure. Thus, when the flip-chip package substrate according to the present disclosure is applied in high-integration/large scale semiconductor packaging process, package warpage can be prevented.

Therefore, the following effects are achieved by the features according to the present disclosure:

1. With the support of the high-rigidity core structure 2a, 3a provided by the flip-chip package substrate 2, 2', 3, 3' according to the present disclosure, although different CTEs exist between the various layers, during high-integration/large scale packaging process for the electronic package 2", 3", no warpage is created in the flip-chip package substrate 2, 2', 3, 3', and poor electrical connections with an electronic component 90 (or the prior-art semiconductor chip 19), such as no bonding of the conductive bumps 91, the conductive components 28, 38 or the soldering materials 13' or with a circuit board, such as no bonding of the prior-art soldering materials 13" can be eliminated. Fracture or electrical failure of the electronic component 90 (or the prior-art semiconductor chip 19) due to thermal stress can also be prevented.

2. With the support of the high-rigidity core structure 2a, 3a provided by the flip-chip package substrate 2, 2', 3, 3' according to the present disclosure, the flip-chip package substrate 2, 2', 3, 3' and the electronic package 2", 3" produced based on it are suitable for high-integration/large scale packaging process and miniaturization.

3. Since the middle layer 21, 31 according to the present disclosure can be kept thin, the end faces of the conductive portions 20, 30 according to the present disclosure can be minimized as needed, thereby realizing fine line pitch between the conductive portions 20, 30.

4. Since fine line pitch can be achieved for the conductive portions 20, 30, limitations for the layout of the circuit portions 25, 26 can be reduced, making it easier to produce high-density circuit layout.

5. Since the middle layer 21, 31 according to the present disclosure can be kept thin, the heights of the conductive portions 20, 30 will not be increased, thereby lowering the resistance and improving electrical properties.

6. Since the middle layer 21, 31 according to the present disclosure can be kept thin, the level of difficulty and the cost in manufacturing the through holes in the middle layer 21, 31 can be significantly reduced.

7. With the support of the high-rigidity core structure 2a, 3a provided by the flip-chip package substrate 2, 2', 3, 3' according to the present disclosure, the flip-chip package substrate 2, 2', 3, 3' and the electronic package 2", 3" produced based on it can be kept thin, which effectively improves heat dissipation of the electronic package 2", 3", ensuring stability of performance delivered by the end products.

The above embodiments are used only to illustrate the principles of the present disclosure and its effect, rather than to limit the present disclosure. The above embodiments can be modified by one of ordinary skill in the art without departing from the spirit and scope of the present disclosure.

Therefore, the scope claimed of the present disclosure should be defined by the following claims.

What is claimed is:

1. A flip-chip package substrate, comprising:
a middle layer including a first side and a second side opposing the first side, wherein the middle layer is made by an insulating material;
a plurality of first conductive pillars provided in and penetrating the middle layer, each of the first conductive pillars having two opposing ends flush with and exposed from the first side and the second side of the middle layer, respectively;
a plurality of reinforcement layers bonded to the first side and the second side of the middle layer, a plurality of openings being formed in the reinforcement layers at places corresponding to where the first conductive pillars are provided in the middle layer, wherein the middle layer and the reinforcement layers form a core structure;
a plurality of insulating portions provided on the first side and the second side of the middle layer, each of the insulating portions including a first insulating layer and a second insulating layer, the reinforcement layers being bonded to the first side and the second side via a respective one of the first insulating layers, and the reinforcement layers and the openings being covered by a respective one of the second insulating layers;
a plurality of second conductive pillars provided in the openings, each of the second conductive pillars having one end in direct contact with the end of one of the first conductive pillars and the other end exposed from a surface of a respective one of the insulating portions, wherein the first conductive pillars and the second conductive pillars form conductive portions, and the insulating portions are between the second conductive pillars and the reinforcement layers; and
a circuit portion formed on the insulating portions and electrically connected with the second conductive pillars of the conductive portions.

2. The flip-chip package substrate of claim 1, wherein the first conductive pillars in the middle layer are formed from single pillars.

3. The flip-chip package substrate of claim 1, wherein the first conductive pillars in the middle layer are formed by stacking a plurality of pillars on one another, and the stacked pillars have end faces of the same or different sizes.

4. The flip-chip package substrate of claim 1, wherein the reinforcement layers are made by electrically conductive materials or electrically insulating materials.

5. A method for preparing a flip-chip package substrate, comprising:
providing an insulating middle layer including a first side and a second side opposing the first side, a plurality of first conductive pillars provided in and penetrating the insulating middle layer, each of the first conductive pillars having two opposite ends exposed from the first side and the second side of the insulating middle layer, respectively;
bonding a reinforcement layer to each of the first side and the second side of the middle layer via a respective one of the first insulating layers;
forming a plurality of openings in the reinforcement layers at places corresponding to where the first conductive pillars are provided in the insulating middle layer;
forming a respective one of the second insulating layers on the reinforcement layers and in the openings, wherein the first insulating layers and the second insulating layers form insulating portions covering the reinforcement layers;
forming second conductive pillars in the insulating portions at places corresponding to where the openings are formed in the reinforcement layers, each of the second conductive pillars having one end connected to one of the first conductive pillars and the other end exposed from a surface of a respective one of the insulating portions, such that the first conductive pillars and the second conductive pillars form conductive portions; and
forming on the insulating portions a circuit portion electrically connected with the second conductive pillars of the conductive portions.

6. The method of claim 5, wherein the first conductive pillars provided in the middle layer are formed from a single pillar.

7. The method of claim 5, wherein the first conductive pillars provided in the middle layer are formed from stacking a plurality of pillars on one another, and the stacked pillars have end faces of the same or different sizes.

8. The method of claim 5, wherein at least one of the first conductive pillars and the second conductive pillars is formed by electroplating, deposition or filling of a conductive material.

9. The method of claim 5, wherein the reinforcement layers are made of electrically conductive materials or electrically insulating materials.

10. A method for preparing a flip-chip package substrate, comprising:
providing a conductive middle layer including a first side and a second side opposing the first side, with the second side of the middle layer bonded to a reinforcement layer via a first insulating layer;
forming a plurality of annular openings in the middle layer to delineate first conductive pillars;
bonding another reinforcement layer to the first side of the middle layer via another first insulating layer, and the another first insulating layer being filled into the openings for insulating the middle layer from the first conductive pillars;
forming a plurality of openings in the reinforcement layers at places corresponding to where the first conductive pillars are provided on the middle layer;
forming second insulating layers on the reinforcement layers and in the openings, wherein the first insulating layers and the second insulating layers form insulating portions covering the reinforcement layers;
forming second conductive pillars in the insulating portions at places corresponding to where the openings are formed in the reinforcement layers, wherein each of the second conductive pillars has one end connected to one of the first conductive pillars and the other end exposed from a surface of a respective one of the insulating portions, such that the first conductive pillars and the second conductive pillars form conductive portions; and
forming on the insulating portions a circuit portion electrically connected with the second conductive pillars of the conductive portions.

11. The method of claim 10, wherein the reinforcement layers are made of electrically conductive materials or electrically insulating materials.

12. The method of claim 10, wherein the second conductive pillars are formed by electroplating, deposition or filling of a conductive material.

13. A flip-chip package substrate, comprising:
- a middle layer including a first side and a second side opposing the first side, wherein the middle layer is made of an electrically conductive material;
- a plurality of first conductive pillars provided in and penetrating the middle layer, each of the first conductive pillars having two opposing ends exposed from the first side and the second side of the middle layer, respectively, wherein annular openings are formed between the middle layer and the first conductive pillars and electrically insulated from one another;
- a plurality of reinforcement layers bonded to the first side and the second side of the middle layer, a plurality of openings being formed in the reinforcement layers at places corresponding to where the first conductive pillars are provided in the middle layer, wherein the middle layer and the reinforcement layers form a core structure;
- a plurality of insulating portions provided on the first side and the second side of the middle layer, each of the insulating portions including a first insulating layer and a second insulating layer, the reinforcement layers being bonded to the first side and the second side via a respective one of the first insulating layers, and the reinforcement layers and the openings being covered by a respective one of the second insulating layers;
- a plurality of second conductive pillars provided in the openings, each of the second conductive pillars having one end connected to one of the first conductive pillars and the other end exposed from a surface of a respective one of the insulating portions, wherein the first conductive pillars and the second conductive pillars form conductive portions; and
- a circuit portion formed on the insulating portions and electrically connected with the second conductive pillars of the conductive portions.

14. The flip-chip package substrate of claim 13, wherein the annular openings between the middle layer and the first conductive pillars are formed with the first insulating layers.

15. The flip-chip package substrate of claim 13, wherein the reinforcement layers are made by electrically conductive materials or electrically insulating materials.

* * * * *